United States Patent
Solmeyer et al.

(10) Patent No.: US 11,187,530 B2
(45) Date of Patent: Nov. 30, 2021

(54) OPTICAL GIMBAL

(71) Applicant: Honeywell International Inc., Morris Plains, NJ (US)

(72) Inventors: Neal Eldrich Solmeyer, Edina, MN (US); Karl D. Nelson, Plymouth, MN (US); Robert Compton, Loretto, MN (US)

(73) Assignee: Honeywell International Inc., Charlotte, NC (US)

( * ) Notice: Subject to any disclaimer, the term of this patent is extended or adjusted under 35 U.S.C. 154(b) by 120 days.

(21) Appl. No.: 16/595,320

(22) Filed: Oct. 7, 2019

(65) Prior Publication Data

US 2021/0102809 A1     Apr. 8, 2021

(51) Int. Cl.
| | | |
|---|---|---|
| *G01C 19/58* | (2006.01) | |
| *G01P 15/03* | (2006.01) | |
| *G01C 21/16* | (2006.01) | |

(52) U.S. Cl.
CPC .............. *G01C 19/58* (2013.01); *G01C 21/16* (2013.01); *G01P 15/03* (2013.01)

(58) Field of Classification Search
CPC ........ G01C 19/58; G01C 19/62; G01C 19/64; G01C 21/16; H03L 7/26; H03B 17/00; G01B 9/02
See application file for complete search history.

(56) References Cited

U.S. PATENT DOCUMENTS

| | | | |
|---|---|---|---|
| 9,175,960 B1 | 11/2015 | Compton | |
| 10,444,016 B1* | 10/2019 | Kasevich | ............... G01C 19/58 |
| 2010/0033256 A1* | 2/2010 | Strabley | ................... G04F 5/14 |
| | | | 331/94.1 |
| 2014/0375998 A1* | 12/2014 | Kasevich | ........... G01B 9/02041 |
| | | | 356/450 |
| 2015/0015251 A1* | 1/2015 | Bulatowicz | ............ G01R 33/26 |
| | | | 324/304 |
| 2016/0216114 A1* | 7/2016 | Kotru | ....................... G01P 15/08 |
| 2016/0298967 A1* | 10/2016 | Johnson | ............... G01C 21/165 |
| 2016/0377436 A1* | 12/2016 | Compton | ............... G01C 19/60 |
| | | | 356/460 |

(Continued)

FOREIGN PATENT DOCUMENTS

EP     2685212 A2     1/2014

OTHER PUBLICATIONS

Barrett et al., "Inertial quantum sensors using light and matter", 2016, pp. 1-20.

(Continued)

*Primary Examiner* — Helen C Kwok
(74) *Attorney, Agent, or Firm* — Fogg & Powers LLC (57) ABSTRACT

In an example, an optical gimbal is described, the optical gimbal comprising: a pulse generator configured to generate at least two coherent beam splitting pulses; a first optical beam director configured to tilt the vector of the beam splitting pulses by an angle $\theta$; an atom source configured to allow the beam splitting pulses to manipulate trapped atoms within the atom source; a processor configured to receive the angle $\theta$, and control the pulse generator and the beam director; a detector coupled to the atom source configured to measure a final population of the atoms in different states.

18 Claims, 4 Drawing Sheets

(56) References Cited

U.S. PATENT DOCUMENTS

2017/0370840 A1* 12/2017 Sinclair .............. G01N 21/6404

OTHER PUBLICATIONS

Bidel et al., "Absolute marine gravimetry with matter-wave interferometry", Nature Communications, 2018, pp. 1-9.
Mcguinness et al., "High data-rate atom interferometer for measuring acceleration", Applied Physics Letters, Sep. 21, 2011, pp. 1-4.
Tackmann, "Raman interferometry with free-falling and trapped atoms", Atomic Physics, Mar. 26, 2014, pp. 1-231, HAL.
European Patent Office, "Extended European Search Report from EP Application No. 20198566.0", from Foreign Counterpart to U.S. Appl. No. 16/595,320, dated Feb. 16, 2021, pp. 1 through 10, Published: EP.
Peters et al., "High-precision gravity measurements using atom interferometry", Metrologia 38, 2001, pp. 25 through 61.
Wu et al., "Gravity surveys using a mobile atom interferometer", at least as early as Apr. 19, 2019, pp. 1 through 27.

\* cited by examiner

OPTICAL GIMBAL

BACKGROUND

Atomic inertial sensors are capable of very sensitive measurements; however, they are complex, expensive, and only capable of measurement along a fixed angle. Some atomic inertial sensors, such as accelerometers, gyroscopes, and gravimeters, may use optical beams to acquire inertial measurements. Many atomic inertial sensors that use optics propagate beams to acquire inertial measurements. Because of this reliance on the propagation of beam(s), these atomic inertial sensors that use optics are generally sensitive along a fixed axis that is defined by the physical direction of propagation of the beam(s). For example, a system configured to measure gravity may use a vertically directed laser beam. A measurement taken by an atomic accelerometer reflects the acceleration of the sensor with respect to the atoms, which are typically in free fall, along the direction of the propagation of the beam.

Because atomic inertial sensors are sensitive along a single, fixed axis, one approach to performing measurements in a dynamic environment is to mount the atomic inertial sensors on a gimbal. A gimbal is a pivoted support that provides a mechanism by which orientation sensitive equipment can be maneuvered. When atomic inertial sensors need to measure along a new axis, a physical gimbal maneuvers the entire atomic inertial sensor so the atomic inertial sensor is sensitive along the desired new angle.

SUMMARY

The Embodiments of the present invention provide methods and systems for an optical gimbal and will be understood by one skilled in the art after reading and studying the following specification.

In an example, an optical gimbal is described, the optical gimbal comprising: a pulse generator configured to generate at least two coherent beam splitting pulses; a first optical beam director configured to tilt the vector of the beam splitting pulses by an angle θ; an atom source configured to allow the beam splitting pulses to manipulate trapped atoms within the atom source; a processor configured to receive the angle θ, and control the pulse generator and the beam director; and a detector coupled to the atom source configured to measure a final population of the atoms in different states.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

An accelerometer designed to make measurements purely in the vertical direction, as defined by the direction of gravity, is called a gravimeter. If the gravimeter cannot be maintained vertically, multiple inertial sensors would be used to compensate for the off vertical gravimeter. In some examples, several gravimeters could be positioned along differing axes requiring inertial measurements, or one or more atomic inertial sensor would be tilted, or gimballed, to an angle off of the initial axis of propagation such that the atomic inertial sensor was physically positioned to be sensitive along the desired axis. There are many applications that use measurements along multiple sense axes, requiring the adjustment of the sense axis of the inertial sensor (e.g. in dynamic environments where the sensor itself is changing orientation, or if one wanted to measure different components of acceleration or rotation). However, it may not be practical, because of space or cost, to build multiple devices, especially highly sensitive atomic inertial sensors.

Furthermore, it may also be desirable to have a strap-down solution, without the need for a large and unreliable mechanical gimbal. For example, seafaring ships and aircraft require accelerometers, gyroscopes, and gravimeters for a variety of purposes. Especially in the limited spaces of these vehicles, there is a need to limit the space and cost associated with these atomic inertial sensors. One solution is to provide mechanical gimballing to mechanically adjust the orientation of the atomic inertial sensors. But mechanical gimballing may be unreliable and relies on imprecise mechanics which may interfere with the inherently precise measurements of the atomic inertial sensors. Thus, there is a need for an alternative to mechanical gimballing to direct the narrow beam of the accelerometer.

During the measurement procedure an atomic inertial sensor coherently splits atoms into a superposition of two matter waves. Generally speaking, this is done with a pulse (or pulses) of light which interacts with the atom. The pulse of light is generally comprised of two counter-propagating beams with slightly different frequencies. The initial state of the atom is modified such that the initial momentum, p, of the atom translates to p→p+hΔk, where his the known value of Planck's constant. The internal electronic state of the atomic wavefunction may also change depending on the frequencies of the two beams. Thus, the initial momentum of the atom changes by a factor of Planck's constant, where the factor, Δk is the difference in k-vectors of the two counter-propagating beams of light, which difference depends on the wavelength, detuning, and orientation of the counter-propagating beams and is determinant on the orientation of the atomic inertial sensor. Subsequent pulses of counter-propagating pairs of light beams serve to recombine the two halves of the atomic superposition. The motional state and/or the internal electronic state of the atoms at the end of the measurement sequence, depends on the quantum phase that has accumulated during the time between the pulses. This phase depends on the acceleration that the sensor experienced relative to the atoms, which are in free fall during the measurement time, along the k-direction of the counter-propagating beam pairs. Thus, tilting the wave front of the beam within an atomic inertial sensor can optically gimbal the atomic inertial sensor to be sensitive to a range of axes, without the need for physical gimbaling.

Figure 1:
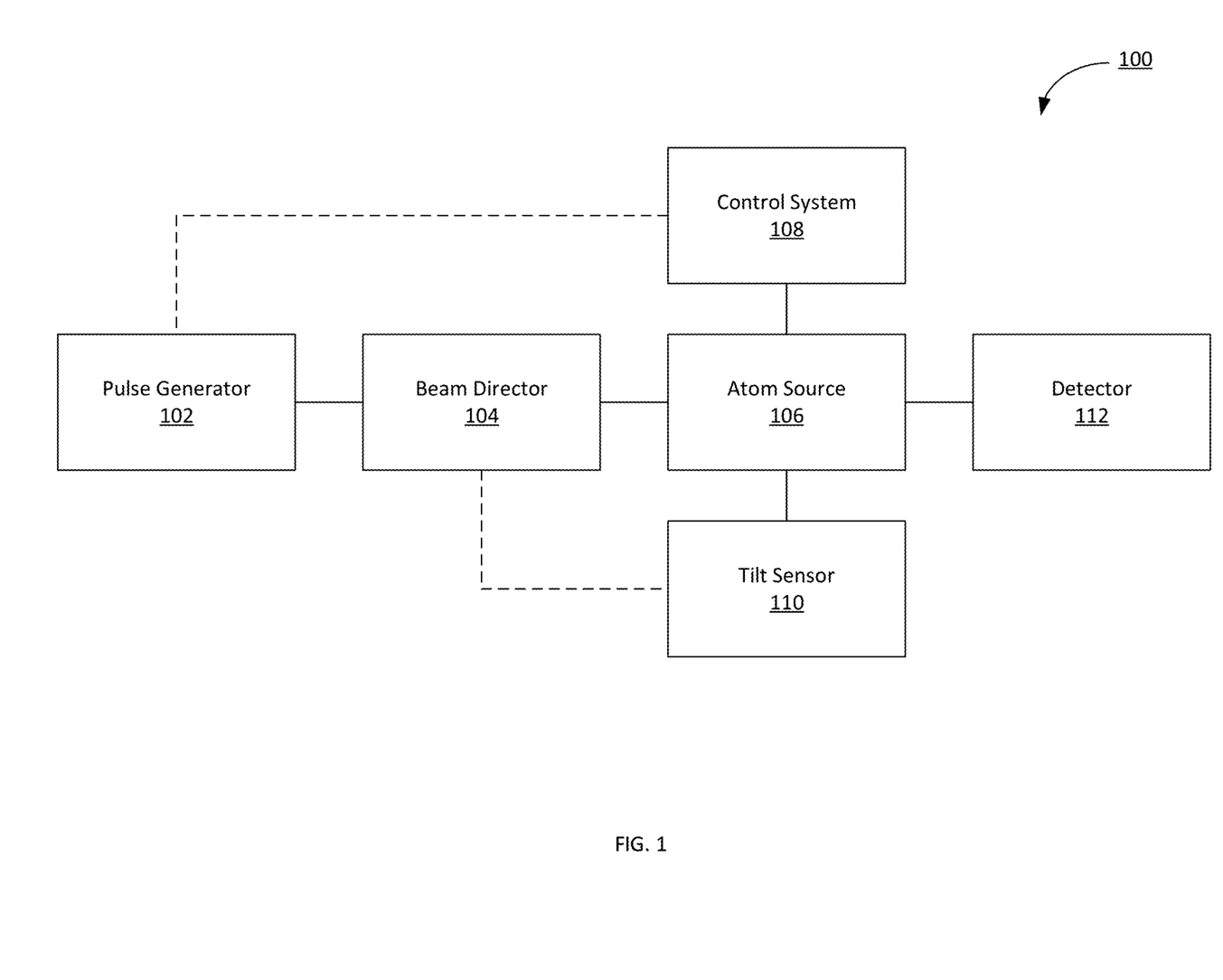
FIG. 1 is a block diagram of an optically gimballed detector.

In FIG. 1, an example block diagram illustrates different components in an embodiment of an optical gimbal 100. In the optical gimbal 100, a pulse generator 102 optically couples to a beam director 104. A beam director 104 is an optical device which is configured to redirect beams maintaining the integrity of the input beam while potentially modifying the beam. The beam director 104 may optically couple to an atom source 106 where the atom source 106 couples to a control system 108, a detector 112, and, in some examples, a tilt sensor 110. In some embodiments, the tilt sensor 110 provides a feedback to the beam director 104. In some embodiments, the control system 108 provides a feedback to the pulse generator 102.

The pulse generator 102 controls the duration and/or intensity of a series of light pulses, or in some cases a continuous wave beam. The pulses are comprised of a counter-propagating pair of light beams that are detuned from an atomic resonance, (typically by an amount greater than 1 GHz). The difference of the frequency between the two counter-propagating beams determines the momentum imparted to the two halves of the superposition and may include a transition to a different electronic state as well as a different momentum. The electronic state and the momentum of the atom convey information which can be used to determine information about the system. The configuration of the pulse generator 102 is determined by the type of atomic interferometer. For example, in an accelerometer, the pulse generator would use a $\pi/2$-$\pi$-$\pi/2$ Raman interferometer scheme with a three beam pulse sequence. The first $\pi/2$ pulse splits the atoms into a superposition of two matter waves, the $\pi$ pulse switches the state of the two halves (motional and electronic), so that the two halves begin returning towards one another, and the final $\pi/2$ pulse overlaps the wave function so that an interference can be measured in the population difference between two potential output states of the interferometer. In some examples, the pulse generator 102 is a light emitting device configured to emit the light in a configurable series of pulses.

The beam director 104 receives the beam from the pulse generator 102 and modifies the k-vector of the beam. Generally, the beam director 104 provides a variable linear phase shift along the beam width which allows for the dynamic alignment of the sense axis. In one example, a dynamic linear phase shift can be produced with an optical phased array. In other examples, the dynamic linear phase shift is provided using one of actuated mirrors, spatial light modulators, liquid crystal modulators, and deformable microlenses.

Atomic interferometers have sensitivity that depends on the vector defined by the wave-vectors of the beam splitting pulses. The implementation of a beam director allows for a single device to measure along a range of angles by dynamically adjusting the pointing of the beam splitting pulses to adjust the k-vectors. The k-vector of a wave can only be tilted so far before being the power required to excite the atom becomes too great, less than the angle at which the co-propagating beams cease to overlap.

The phased tilted beam travels to interact with an atom source 106. In some examples, the atom source is a magneto optical trap. In other examples, the atom source is one of an optical dipole trap, a magnetic trap, and atomic beam, an ultra-cold atomic fountain, or another atom trap. During the interferometer pulse sequence, the atoms are released from the trap, and are in free-fall during the measurement procedure. The atoms are manipulated by the beam pulses. After the three beam pulse sequence, a fourth, detection beam pulse is applied to the atoms, which interacts with the atoms such that the fluorescence, or absorption of the beam, depends on the population of the atoms in the two potential output states of the interferometer. Measurement of the absorption of the measurement beam or the fluorescence of the atoms by a detector 112, can determine the final population of the atoms at the end of the measurement sequence. Which, for example, for an accelerometer, the detector 112 can determine the acceleration of the system along the vector of the counter-propagating beam pairs. Tilting the k-vector of the beams can provide information about the acceleration in the direction of the modified k-vector. In some examples, the detector 112 determines the acceleration. In some examples, the detector 112 provides a signal to an external system, the signal being used by the external system to determine acceleration.

Thus, if the k-vector is tilted by an angle, θ, then the atomic inertial sensor will measure along the vector θ off of the direction of the beam's propagation. For example, in the case where the atomic inertial sensor is a gravimeter the gravimeter measures acceleration, in this case due to earth's gravity. The gravimeter using a tilted wave front would measure acceleration due to gravity as the following equation:

$$a_g = a_z/\cos(\Delta\theta) \quad (1)$$

where $a_z$ is the component of the acceleration vector in the direction of the particular k-vector. In systems comprising one or more optically gimbaled atomic inertial sensors, the multiple optically gimbaled atomic inertial sensors may be used in conjunction. In one configuration, three optically gimbaled atomic inertial sensors are orthogonal to one another, with the sensor measuring the greatest magnitude of the given inertial value being used for the result. In this configuration, all three sensors are actively gimballed to set two orthogonal to the net acceleration, and one set parallel to the acceleration. In other embodiments, a single optical gimbal is dithered to maximize projections along an acceleration vector. In some embodiments, solid state sensors provide an approximate angle of the net acceleration vector.

In some examples, the leading error of the system can be recorded as:

$$\propto (\Delta\theta^2/2) \quad (2)$$

Note, there is no dependence on θ itself, but only Δθ. Thus, the optical gimbal gives the benefits of gimballing in a strap-down system with no moving parts. Co-sensors commercial off-the-shelf inertial measurement units (COTS IMU) determine θ with some error Δθ. This is determined with high bandwidth but lower sensitivity than required for a gravitational measurement. Thus, unlike a physical gimbal system, the error growth of the optical gimbal does not increase with the increased tilt of the system. Thus, for example, a COTS IMU with noise of ~70 μg leads to $\Delta\theta = 70 \times 10^{-6}$ radians.

The beam director 104 can take many different forms including but not limited to actuated mirrors, a phased array emitter, liquid crystal deflectors, deformable micro-lens array, or spatial light modulator. These beam directors achieve wave-front control and provide the pulse beam with an adjusted wave-front based on the desired measurement direction.

Figure 2:
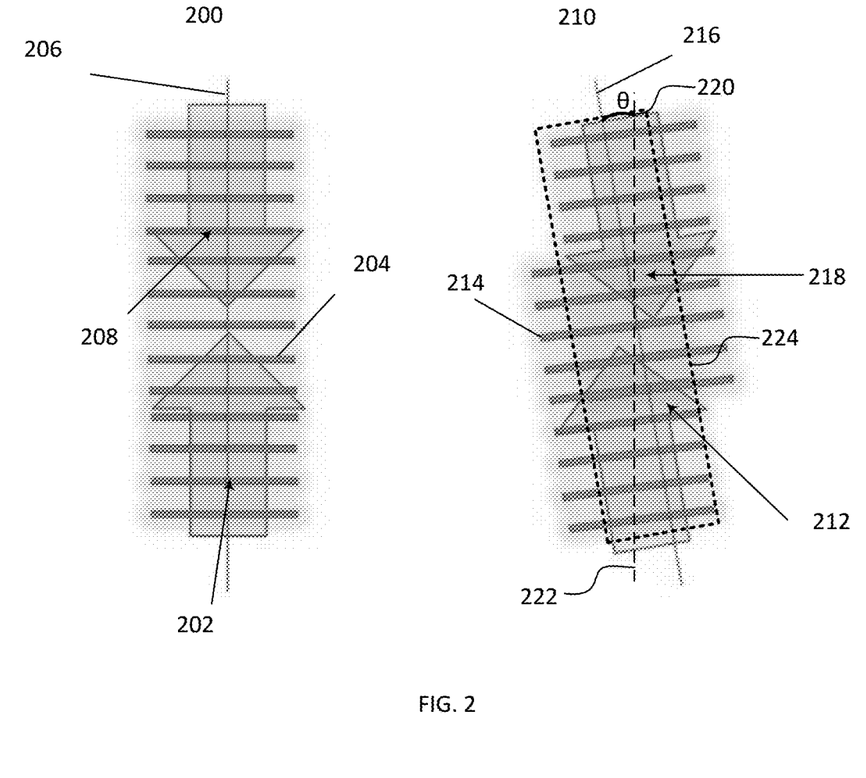
FIG. 2 is an example of two propagate waves one with a wave front normal to the direction of travel and one wave front tilted against the direction of travel.

In FIG. 2, an example of a straight beam 200 and an example 210 of a tilted wave front are shown. On the left, a straight beam 200 is shown for comparison. In the straight beam 200 example, a first beam 202 propagates from a pulse generator 102 represented in periodic wave fronts 204. The waves propagate along the axis 206 such that the wave fronts 204 are perpendicular to the axis 206. In this example, the straight beam 200 is reflected and a second beam 208 propagates along the same axis as the first signal. Because the wave front 204 is perpendicular to the axis 206 representing the direction of travel, the wave fronts 204 remain parallel. Between the beam director, there is an area where the first beam 202 and the second beam 208 are counter propagating. Because the beams have not been tilted, the first beam 202 and the second beam 208 completely, or almost completely counter propagate. Thus, the first beam 202 and the second beam 208 almost completely overlap. Within the counter propagation area of the first beam 202 and the second beam 208, measurements of an atomic source occur.

In the tilted wave front example 210, a first beam 212 propagates from a pulse generator 102 just as the straight beam 200, where the beam is represented in periodic wave fronts 214. Unlike the straight beam 200, the tilted beam 210 has been phased such that the wave fronts 214 propagate along an axis 216 tilted off the original axis 222. The original axis 222 is defined as the axis of propagation before the optical gimballing. The axis 216 along which the wave fronts 214 propagate, also denoted as a "k vector", are tilted off the original axis 222 by an angle, θ 220. A second beam 218 propagates along the same axis 216 as the first beam 212. Between the beam director, there is an area 224 where the first beam 212 and the second beam 218 counter propagate in a tilted angle 220, denoted within the dotted rectangle. Because the beams 212, 218 are tilted, and the beams 212, 218 do not completely overlap 224 as in the un-tilted embodiment, the intensity between the beams 212, 218 is reduced. This can be compensated for by increasing the power of the pulses. Thus, given a sufficiently large power source, the tilted angle can be increased so long as the counter propagating beams 212, 218 overlap 224.

In some examples the first beam 212 and the second beam 218 are tilted by separate beam directors 104. In other examples, the first beam 212 and second beam 218 are tilted by a single beam director with a reflection component.

The tilted wave front 214 can be achieved using various implementations. In one example, the tilted wave front 214 is accomplished using a phased array emitter, depicted in FIG. 3, in which the signal received by the phased array emitter is emitted from a multitude of emitter outputs at different phases such that the wave front of the multiple radio signals establishes a single wave front. Using the offset phases, the wave front can be set along a collection of k-vectors. There are many different systems which can produce this result, such as actuated mirrors, spatial light modulators, liquid crystal modulators, and deformable micro-lenses; however, it is understood that the effect of a wave front with an angled k-vector could be achieved using a system not specifically referenced.

Figure 3:
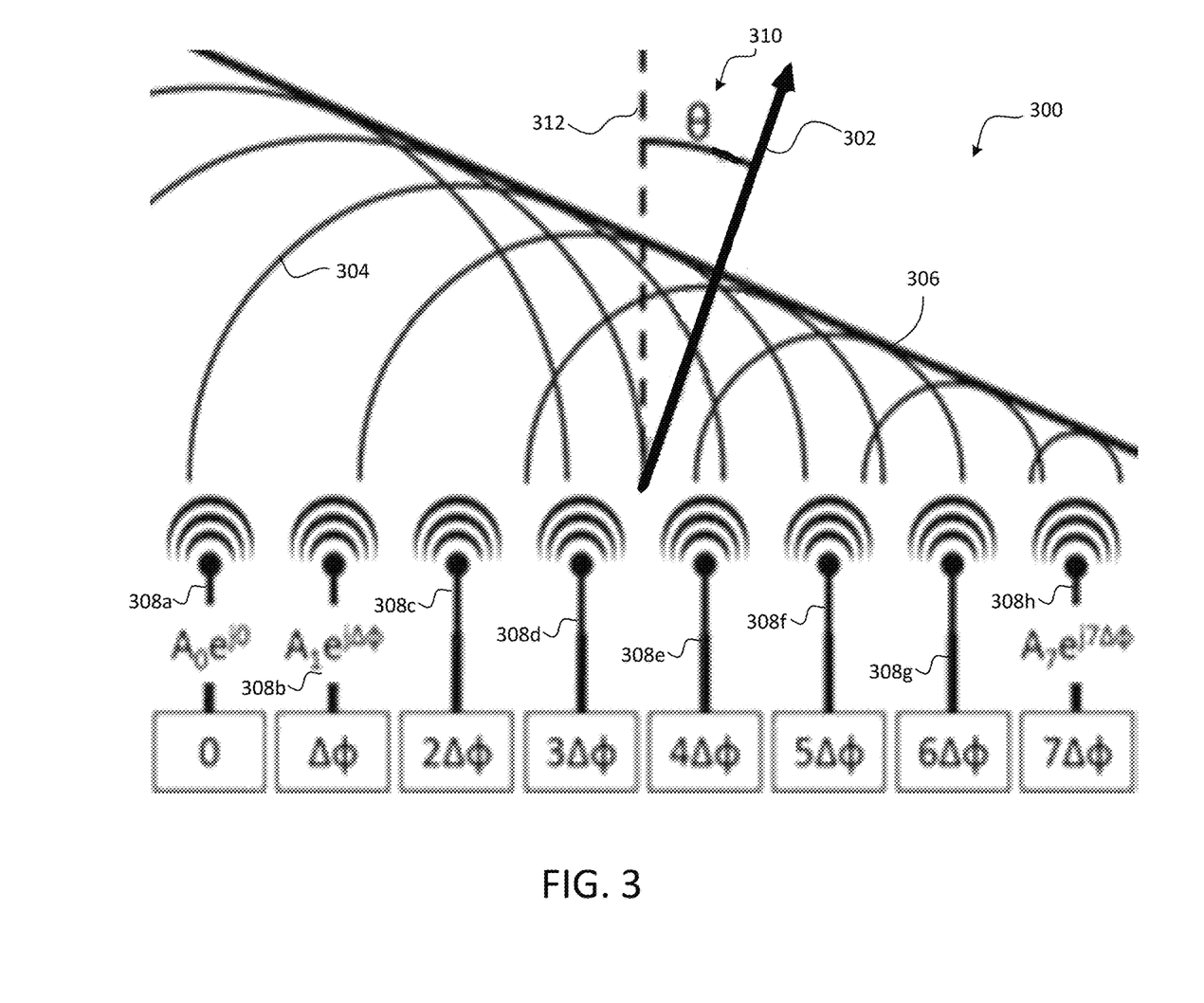
FIG. 3 is a depiction of a phased array emitter.

FIG. 3 is an example of a phased array emitter 300 used as a beam director 104. In the example, the phased array emitter 300 receives a signal and provides the signal to a number of antennae 308. These antennae 308 transmit the received signal subsequent to one another in phase. Thus, transmitted signal 304 of each antenna 308 combine together to form a linear signal wall 306, the direction 302 of which is determined by the phase difference of each of the antenna 308. In the example given, the first antenna 308*a* transmits without a delay, the second antenna 308*b* transmits delayed by Δϕ, the third antenna 308*c* transmits delayed by 2Δϕ, and each subsequent antenna 308 transmits with an additional delay of Δϕ added to the delay of the immediately previous antenna. The value of Δϕ by which each antenna is offset determines the angle θ 310 the direction of propagation 302 is off normal 312.

The phased array emitter 300 can transmit at a range of angles θ 310 by manipulating the phase of the antennae 308. The example phased array emitter 300 is limited by the number of antenna 308 and the density of the antennae 308. The greater number of antennae, the range of the angle θ 310 is increased.

In some examples, a 1D array of linearly phased array emitters, as in the example phased array emitter 300, can be used to tilt a signal in one dimension, whereas a 2D phased array emitter can be used to tilt the signal in two directions Adjacent elements of the array are phase delayed by a value of Δϕ, where, for large numbers of elements of the array, the angle of the emitted beam approaches the value θ given by: $\sin\theta = 2\Delta\varphi/\pi$. Thus, the array of phased array emitters has two axes upon which to tilt the signal.

While the phased array emitter 300 is provided in detail as a beam director 104, it is contemplated that the beam director 104 can comprise a number of systems, as described above.

Figure 4:
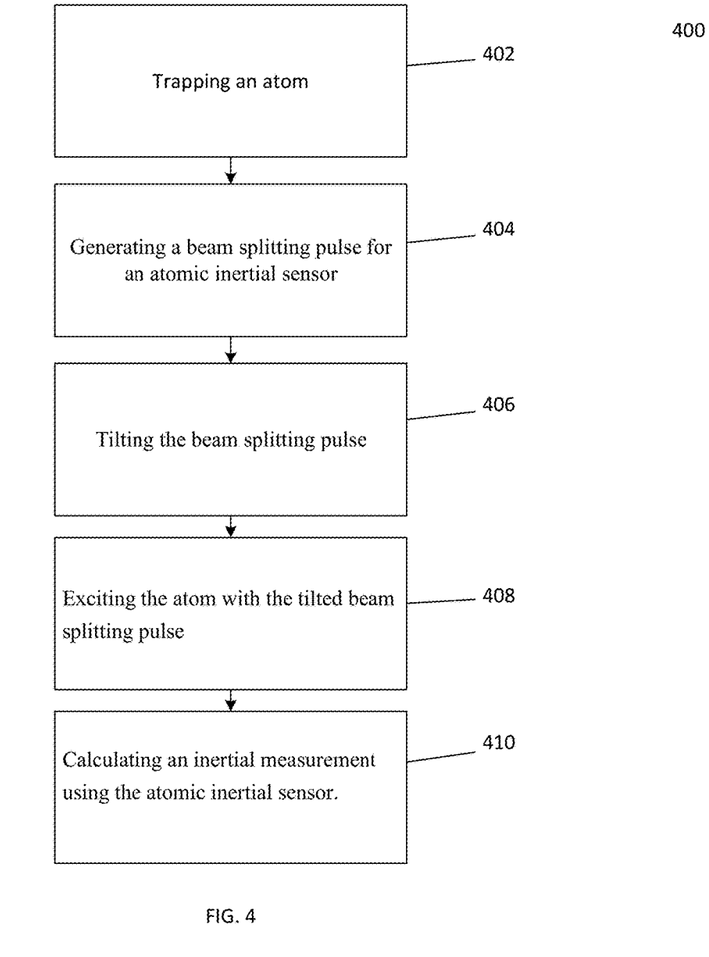
FIG. 4 is a method flow of the operation of an optically gimballed detector.

FIG. 4 shows a flowchart diagram of a method 400 for optically gimballing an interferometer. Method 400 proceeds at block 402 where an atom is trapped. There are many known methods for trapping an atom. One such method for trapping an atom is through a magnetic trap. In a magnetic trap, magnetic field gradients are used to trap neutral atoms using the magnetic moments of the atoms. In many configurations, magnetic traps rely on laser cooling of the atoms in order to ensure that the atoms do not escape the magnetic fields.

Method 400 proceeds at block 404 where a beam splitting pulse is generated as part of an atomic inertial sensor. The beam splitter may comprise a number of configurations. For example, the beam splitting pulse may be in a Raman configuration, or another configuration. The beam splitting pulses are configured to excite the trapped atom such that the excited states of the atom provide information, whether acceleration, rotational information, or another inertial measurement.

Method 400 proceeds at block 406 where the beam splitting pulse is tilted, such that the wave vector of the beam splitting pulse is along a vector. One method of tilting the beam splitting pulse is through a phased array, in which multiple phased signals form a tilted wave front. In this way, the beam splitting pulse continues to propagate along the initial direction, but the wave front tilts along another vector, referred to as a k-vector.

Method 400 proceeds at block 408 where the trapped atom is excited using the tilted beam splitting pulse. The tilted wave fronts excite the atom. An atom excited by a wave front of a beam splitting pulse is split into a superposition of two matter waves related to the beam splitting pulse. Additional beam pulses then recombine the two halves of the atomic superposition.

Method 400 proceeds at block 410 where an inertial measurement is calculated using the atomic inertial sensor. As the two halves of the superposition are re-combined, the final states of the atoms can be measured, which determines the acceleration of the sensor with respect to the free-falling atoms along the k-vector of the tilted wave front.

EXAMPLE EMBODIMENTS

Example 1 includes an optical gimbal comprising: a pulse generator configured to generate at least two coherent beam splitting pulses; a first optical beam director configured to tilt the vector of the beam splitting pulses by an angle θ; an atom source configured to allow the beam splitting pulses to manipulate trapped atoms within the atom source; a processor configured to receive the angle θ, and control the pulse generator and the beam director; and a detector coupled to the atom source configured to measure a final population of the atoms in different states.

Example 2 includes the optical gimbal of Example 1, further comprising: a second optical beam director configured to tilt the vector of the beam splitting pulses by an angle θ; wherein the beam splitting pulses tilted by the first optical beam director and the beam splitting pulses tilted by the second optical beam director overlap.

Example 3 includes the optical gimbal of Examples 1-2, wherein the atom source is one of a magneto optical trap, an optical dipole trap, a magnetic trap, an atomic beam, and an ultra-cold atomic fountain.

Example 4 includes the optical gimbal of Examples 1-3, wherein the pulse generator is configured to generate pulses for a sensor, wherein the sensor is one of an accelerometer, and a gyroscope Example 5 includes the optical gimbal of Examples 1-4, wherein the pulse generate generates along a normal axis, and wherein the vector is configured to be within Δθ off the normal axis.

Example 6 includes the optical gimbal of Examples 1-5, wherein the beam deflector is one of a phased array emitter, actuated mirrors, spatial light modulators, liquid crystal modulators, and deformable micro-lenses.

Example 7 includes the optical gimbal of Examples 1-6, further comprising an inertial measurement unit coupled to the one or more optical gimbals; and wherein the inertial measurement unit is configured to set the angle θ of the one or more optical gimbals.

Example 8 includes a method comprising: trapping a collection of atoms; generating a beam splitting pulse for an atomic inertial sensor; tilting the beam splitting pulse, wherein the beam splitting pulse has a wave-vector, such that the wave-vector of the beam splitting pulse is along a vector; exciting the atom with the tilted beam splitting pulse calculating an inertial measurement using the atomic inertial sensor.

Example 9 includes the method of Example 8, further comprising: adjusting the wave-vector across a range of vectors until a maximum in phase shift due to acceleration is determined.

Example 10 includes the method of Example 9, wherein the beam spitting pulse is directed along a normal axis, and wherein the vector is configured to be within Δθ off the normal axis.

Example 11 includes the method of Examples 8-10, wherein the collection of atoms are trapped within one of a magneto optical trap, an optical dipole trap, a magnetic trap, an atomic beam, and an ultra-cold atomic fountain.

Example 12 includes the method of Examples 8-11, wherein a beam deflector tilts the beam splitting pulse, wherein the beam deflector is one of a phased array emitter, actuated mirrors, spatial light modulators, liquid crystal modulators, and deformable micro-lenses.

Example 13 includes a system comprising: a vehicle one or more optical gimbals attached to the vehicle, wherein the one or more optical gimbals include, a pulse generator configured to generate at least two coherent beam splitting pulses, an optical beam director configured to tilt the vector of the beam splitting pulses by an angle θ, an atom source configured to allow the beam splitting pulses to manipulate trapped atoms within the atom source, a processor configured to receive the angle θ, and control the pulse generator and the beam director, and a detector coupled to the atom source configured to measure a final population of the atoms in different states.

Example 14 includes the system of Example 13, further comprising: a second optical beam director configured to tilt the vector of the beam splitting pulses by an angle θ; wherein the beam splitting pulses tilted by the first optical beam director and the beam splitting pulses tilted by the second optical beam director overlap.

Example 15 includes the system of Examples 13-14, wherein the atom source is one of a magneto optical trap, an optical dipole trap, a magnetic trap, an atomic beam, and an ultra-cold atomic fountain.

Example 16 includes the system of Examples 13-15, wherein the atom source is one of a magneto optical trap, an optical dipole trap, a magnetic trap, an atomic beam, and an ultra-cold atomic fountain.

Example 17 includes the system of Examples 13-16, wherein the beam deflector is one of a phased array emitter, actuated mirrors, spatial light modulators, liquid crystal modulators, and deformable micro-lenses.

Example 18 includes the system of Examples 13-17, further comprising an inertial measurement unit coupled to the one or more optical gimbals; and wherein the inertial measurement unit is configured to set the angle θ of the one or more optical gimbals.

Example 19 includes the system of Examples 13-18, wherein the at least one optical gimbal comprises three optical gimbals orthogonal to one another such that each of the three optical gimbals sense along a separate axis in three dimensions.

Example 20 includes the system of Examples 13-19, wherein the vehicle is one of a ship and an aircraft.

What is claimed is:

1. An atomic interferometer comprising:
one or more optical gimbals, wherein an optical gimbal in the one or more optical gimbals comprises:
a pulse generator configured to generate at least two coherent beam splitting pulses;
a first optical beam director configured to control a tilt for a vector of the at least two coherent beam splitting pulses; and
a tilt sensor configured to determine an angle θ, wherein the first optical beam director receives the angle θ and controls the tilt based on the angle θ;
an atom source configured to allow the at least two coherent beam splitting pulses to manipulate trapped atoms within the atom source; and
a detector coupled to the atom source configured to produce a measurement based on a final population of the atoms in different states.

2. The atomic interferometer of claim 1, wherein the optical gimbal further comprises:
a second optical beam director configured to tilt the vector of the at least two coherent beam splitting pulses by the angle θ, wherein the at least two coherent beam splitting pulses tilted by the first optical beam director and the at least two coherent beam splitting pulses tilted by the second optical beam director overlap.

3. The atomic interferometer of claim 1, wherein the atom source is one of a magneto optical trap, an optical dipole trap, a magnetic trap, an atomic beam, and an ultra-cold atomic fountain.

4. The atomic interferometer of claim 1, wherein the pulse generator is configured to generate pulses for a sensor, wherein the sensor is one of an accelerometer, and a gyroscope.

5. The atomic interferometer of claim 1, wherein the pulse generator generates along a normal axis, wherein the vector is configured to be within an angle error off the normal axis.

6. The atomic interferometer of claim 1, wherein the first beam director is one of a phased array emitter, actuated mirrors, spatial light modulators, liquid crystal modulators, and deformable micro-lenses.

7. The atomic interferometer of claim 1, further comprising an inertial measurement unit coupled to the one or more optical gimbals, wherein the inertial measurement unit is configured to set the angle θ for the tilt sensor of the one or more optical gimbals.

8. A method comprising:
trapping a collection of atoms;
generating a beam splitting pulse for an atomic inertial sensor;
tilting the beam splitting pulse, wherein the beam splitting pulse has a wave-vector;
exciting atoms in the collection of atoms with the tilted beam splitting pulse;
adjusting the wave-vector across a range of vectors;
identifying a vector in the range of vectors having a largest phase shift due to acceleration; and
calculating an inertial measurement using the atomic inertial sensor.

9. The method of claim 8, wherein the beam spitting pulse is directed along a normal axis, wherein the vector is configured to be within an angle error off the normal axis.

10. The method of claim 8, wherein the collection of atoms are trapped within one of a magneto optical trap, an optical dipole trap, a magnetic trap, an atomic beam, and an ultra-cold atomic fountain.

11. The method of claim 8, wherein a beam director tilts the beam splitting pulse, wherein the beam director is one of a phased array emitter, actuated mirrors, spatial light modulators, liquid crystal modulators, and deformable micro-lenses.

12. A system comprising:
a vehicle; and
an atomic interferometer attached to the vehicle comprising:
one or more optical gimbals, wherein an optical gimbal in the one or more optical gimbals comprises:
a pulse generator configured to generate at least two coherent beam splitting pulses;
an optical beam director configured to control a tilt for a vector of the at least two coherent beam splitting pulses; and
a processor configured to determine an angle θ, wherein the optical beam director receives the angle θ and controls the tilt based on the angle θ;
an atom source configured to allow the at least two coherent beam splitting pulses to manipulate trapped atoms within the atom source; and
a detector coupled to the atom source configured to produce a measurement based on a final population of the atoms in different states.

13. The system of claim 12, further comprising:
a second optical beam director configured to tilt the vector of the at least two coherent beam splitting pulses by the angle θ; and
wherein the beam splitting pulses tilted by the optical beam director and the at least two coherent beam splitting pulses tilted by the second optical beam director overlap.

14. The system of claim 12, wherein the atom source is one of a magneto optical trap, an optical dipole trap, a magnetic trap, an atomic beam, and an ultra-cold atomic fountain.

15. The system of claim 12, wherein the optical beam director is one of a phased array emitter, actuated mirrors, spatial light modulators, liquid crystal modulators, and deformable micro-lenses.

16. The system of claim 12, further comprising an inertial measurement unit coupled to the one or more optical gimbals; and
wherein the inertial measurement unit configured to provide the angle θ to the processor of the one or more optical gimbals.

17. The system of claim 12, wherein the one or more optical gimbals comprises three optical gimbals orthogonal to one another such that each of the three optical gimbals sense along a separate axis in three dimensions.

18. The system of claim 12, wherein the vehicle is one of a ship and an aircraft.

* * * * *